(12) United States Patent  
Yang

(10) Patent No.: US 8,502,366 B2  
(45) Date of Patent: Aug. 6, 2013

(54) SEMICONDUCTOR PACKAGE

(75) Inventor: Seung Taek Yang, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/339,073

(22) Filed: Dec. 28, 2011

(65) Prior Publication Data

US 2012/0205815 A1  Aug. 16, 2012

(30) Foreign Application Priority Data

Feb. 15, 2011  (KR) .................. 10-2011-0013240

(51) Int. Cl.  
*H01L 23/48* (2006.01)

(52) U.S. Cl.  
USPC ........... 257/685; 257/686; 257/777; 257/778; 257/E23.011

(58) Field of Classification Search  
USPC .................. 257/774, 777–778, 685–686  
See application file for complete search history.

(56) References Cited

U.S. PATENT DOCUMENTS

2010/0237481 A1* 9/2010 Chi et al. .......... 257/685  
2011/0057327 A1* 3/2011 Yoshida et al. ...... 257/777

* cited by examiner

*Primary Examiner* — Thanh Nguyen  
(74) *Attorney, Agent, or Firm* — William Park & Associates Patent Ltd.

(57) ABSTRACT

A semiconductor package includes a body having a first surface and a second surface facing away from the first surface, and formed with a groove in the first surface. First connection parts may electrically connect a portion of the first surface to a portion of the second surface of the body. Second connection parts may electrically connect a portion of a bottom portion of the groove to a portion of the second surface of the body. A lower device may be disposed in the groove of the body, and have third connection parts that are electrically connected with the second connection parts. An upper device may be disposed on the body and the lower device, and have fourth connection parts that are electrically connected with the first connection parts and the third connection parts.

11 Claims, 2 Drawing Sheets

# SEMICONDUCTOR PACKAGE

CROSS-REFERENCE TO RELATED APPLICATIONS

The present application claims priority to Korean patent application number 10-2011-0013240 filed on Feb. 15, 2011, which is incorporated by reference in its entirety.

BACKGROUND OF THE INVENTION

The present invention relates to a semiconductor package, and more particularly, to a semiconductor package that can improve electrical connection between a substrate and an upper semiconductor chip in a stack package structure.

Packaging technologies for a semiconductor device have been developed to satisfy demands for miniaturization and high capacity. One such technology is a stack package capable of satisfying requirements for miniaturization, high capacity, and mounting efficiency.

An example of the stack package includes a COC (chip-on-chip) package in which an upper semiconductor chip is stacked on a lower semiconductor chip.

In the COC package, in order to electrically connect the lower semiconductor chip with the upper semiconductor chip, circuit wiring lines such as redistribution lines or connection members such as bumps are formed.

In some cases a plurality of semiconductor chips with different sizes are stacked and electrically connected with one another on a substrate. For example, a lower semiconductor chip may be attached to a substrate and a plurality of upper semiconductor chips larger than the lower semiconductor chip may be stacked on and electrically connected with the lower semiconductor chip. However, since there is space under the periphery of the upper semiconductor chips due to overhang over the smaller lower semiconductor chip, the upper semiconductor chips are not likely to be appropriately connected with the substrate.

This may lead to degradation of the electrical characteristics and reliability of the package.

BRIEF SUMMARY OF THE INVENTION

An embodiment of the present invention is directed to a semiconductor package that can improve electrical connection between a substrate and an upper semiconductor chip in a stack package structure.

In one embodiment of the present invention, a semiconductor package includes a body having a first surface and a second surface facing away from the first surface, and formed with a groove in the first surface. First connection parts may electrically connect a portion of the first surface to a portion of the second surface of the body. Second connection parts may electrically connect a portion of a bottom portion of the groove to a portion of the second surface. A lower device may be disposed in the groove of the body, and may have third connection parts that may electrically connect with the second connection parts. An upper device larger than the lower device may be disposed on the body and the lower device, and may have fourth connection parts that may be electrically connected with the first connection parts of the body and the third connection parts of the lower device.

The body may be any one of a printed circuit board, a semiconductor chip, a wafer, a silicon interposer, an interposer including a passive device, an interposer including an active device, a printed circuit board including a passive device, and a printed circuit board including an active device.

The lower and upper devices may include semiconductor chips.

The semiconductor package may further include connection members formed between the first connection parts and the fourth connection parts, between the second connection parts and the third connection parts, and between the third connection parts and the fourth connection parts.

The connection members may include any one of a solder bump, a solder paste, a solder ball, a metal bump, a metal paste, a carbon nanotube, an ACI (anisotropic conductive ink), an ACF (anisotropic conductive film) and a conductive paste.

An upper surface of the lower device may be flush with the first surface of the body.

The first and second connection parts may have different sizes.

The first connection parts may be longer than the second connection parts.

The first, second, third, and fourth connection parts may be through vias.

A plurality of upper devices may be stacked over at least one of the body and the lower device.

The semiconductor package may further include a molding member formed on the body to encase the lower and upper devices.

DESCRIPTION OF SPECIFIC EMBODIMENTS

Specific embodiments of the present invention will be described in detail with reference to the accompanying drawings.

It is to be understood that the drawings are not necessarily to scale and in some instances proportions may have been exaggerated in order to more clearly depict certain features of the invention.

Figure 1:
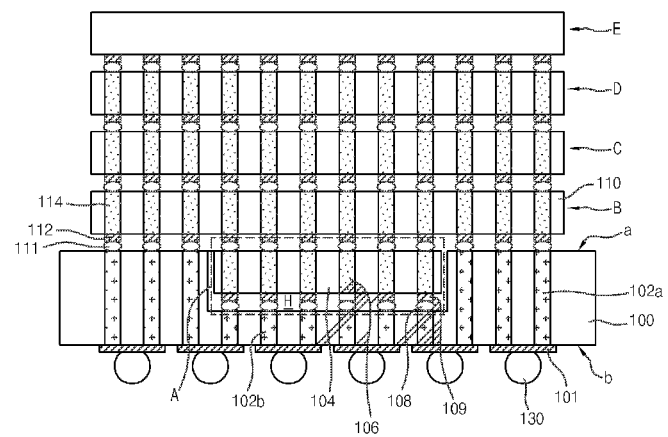
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, the semiconductor package in accordance with the embodiment of the present invention includes a body 100 with a groove H, a lower device A disposed in the groove H, and an upper device B disposed on the lower device A in the groove H of the body 100.

The body 100 has an upper surface a and a lower surface b. The groove H is defined on the upper surface a of the body 100, and ball lands 101 are formed on the lower surface b of the body 100.

For example, the body 100 may comprise any one of a printed circuit board, a semiconductor chip, a wafer, a silicon interposer, an interposer including a passive device, an interposer including an active device, a printed circuit board including a passive device, and a printed circuit board including an active device.

First connection parts 102a and second connection parts 102b are formed through the body 100. The first connection parts 102a electrically connect the upper surface and the lower surface b with each other. The second connection parts 102b may electrically connect the bottom of the groove H and the lower surface b of the body 100. The first and second connection parts 102a and 102b may be, for example, through vias. The first and second connection parts 102a and 102b may have different sizes, where the first connection parts 102a may be longer than the second connection parts 102b.

The lower device A is disposed in the groove H of the body 100, and may, for example, be a first semiconductor chip 104. The first semiconductor chip 104 includes first bonding pads 109 of a face-down type and first bumps 108 which are formed under the first bonding pads 109 as connection members. The first semiconductor chip 104 further includes third connection parts 106 electrically connected with the second connection parts 102b. The third connection parts 106 may be, for example, through vias. Since the lower device A may be inserted into the groove H of the body 100 such that the upper surface of the lower device A is flush with the upper surface of the body 100, a subsequent underfill process may be easily performed.

In succession, the upper device B is disposed on the body 100 including the lower device A. Similarly to the case of the lower device A, the upper device B may, for example, be a second semiconductor chip 110. The second semiconductor chip 110 may include second bonding pads 112 of a face-down type and second bumps 111 formed under the second bonding pads 112 as connection members. At least one such upper device B may be stacked. The reference symbols C, D, and E may denote a plurality of upper devices stacked upon the upper device B. The upper device B is larger than the lower device A. The upper device B includes fourth connection parts 114 electrically connected with the first connection parts 102a of the body 100 and the third connection parts 106 of the lower device A. The fourth connection parts 114 may be, for example, through vias. The plurality of upper devices B, C, D and E may be stacked over at least one of the body 100 and the lower device A.

In an embodiment of the present invention, the first and second bumps 108 and 111 may be exemplified as connection members for electrically connecting the first, second, third and fourth connection parts 102a, 102b, 106, and 114. That is, for electrically connecting the first connection parts 102a with the fourth connection parts 114, the second connection parts 102b with the third connection parts 106, and the third connection parts 106 with the fourth connection parts 114. However, the invention need not be so limited. For example, any one of, for example, a solder bump, a solder paste, a solder ball, a metal bump, a metal paste, a carbon nanotube, an ACI (anisotropic conductive ink), an ACF (anisotropic conductive film) and a conductive paste may be formed between the first connection parts 102a and the fourth connection parts 114, between the second connection parts 102b and the third connection parts 106 and between the third connection parts 106 and the fourth connection parts 114, as a connection member.

External connection terminals 130 such as, for example, solder balls may be attached to the ball lands 101. Accordingly, an embedded COC (chip-on-chip) package structure may be formed in which the upper device B is disposed on the body 100, where the lower device A is in the body 100.

Figure 2:
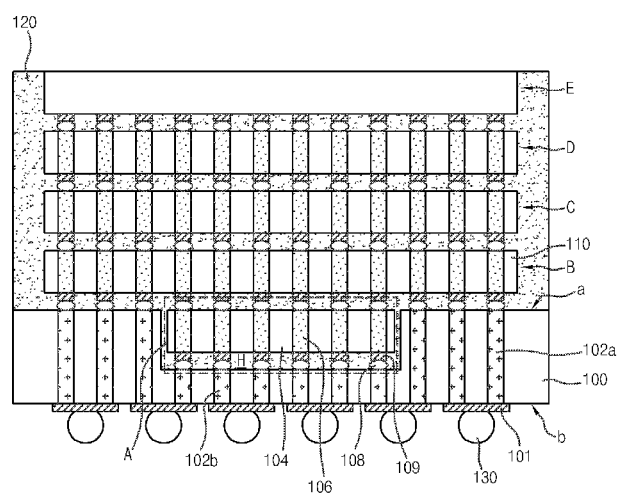
FIG. 2 is a cross-sectional view illustrating a semiconductor package in accordance with another embodiment of the present invention.

FIG. 2 is a cross-sectional view illustrating a semiconductor package in accordance with another embodiment of the present invention. Detailed descriptions of the same or like component elements as those shown in FIG. 1 will be omitted, and only different features will be described.

Referring to FIG. 2, there is further shown, compared to FIG. 1, a molding member 120 formed on the body 100 that encases the lower device A and the upper devices B, C, D and E.

The semiconductor package shown in FIG. 2 is, for example, one molded at a wafer level and individualized through a sawing process.

As is apparent from the above description, in various embodiments of the present invention, a groove is defined in a substrate in a general stack package structure, for example, in a COC (chip-on-chip) package structure. A lower device is inserted into the groove, and an upper device larger than the lower device is stacked on the substrate where the lower device is inserted. This may provide a stable platform such that the upper device is electrically connected with the substrate and the lower device. As a consequence, electrical connection between the substrate and the upper device may be improved. Moreover, in various embodiments of the present invention, because the lower device is inserted into the groove, an underfill process may be easily performed.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
 a body having a first surface and a second surface facing away from the first surface, and formed with a groove in the first surface;
 first connection parts that are configured to electrically connect a portion of the first surface to a portion of the second surface of the body;
 second connection parts that are configured to electrically connect a portion of a bottom portion of the groove to a portion of the second surface of the body;
 a lower device disposed in the groove and having third connection parts that are configured to be electrically connected with the second connection parts;
 an upper device disposed on the body and the lower device and having fourth connection parts that are configured to be electrically connected with the first connection parts and the third connection parts; and
 connection members formed between the first connection parts and the fourth connection parts, between the second connection parts and the third connection parts and between the third connection parts and the fourth connection parts.

2. The semiconductor package according to claim 1, wherein the body is any one of a printed circuit board, a semiconductor chip, a wafer, a silicon interposer, an interposer including a passive device, an interposer including an active device, a printed circuit board including a passive device, and a printed circuit board including an active device.

3. The semiconductor package according to claim 1, wherein the lower and upper devices comprise semiconductor chips.

4. The semiconductor package according to claim 1, wherein the connection members comprise any one of a solder bump, a solder paste, a solder ball, a metal bump, a metal paste, a carbon nanotube, an ACI (anisotropic conductive ink), an ACF (anisotropic conductive film), and a conductive paste.

5. The semiconductor package according to claim 1, wherein an upper surface of the lower device is flush with the first surface of the body.

6. The semiconductor package according to claim 1, wherein the first and second connection parts have different sizes.

7. The semiconductor package according to claim 6, wherein the first connection parts are longer than the second connection parts.

8. The semiconductor package according to claim 1, wherein the first, second, third, and fourth connection parts are through vias.

9. The semiconductor package according to claim 1, wherein the upper device has a size larger than the lower device.

10. The semiconductor package according to claim 1, wherein a plurality of upper devices is stacked over at least one of the body and the lower device.

11. The semiconductor package according to claim 1, further comprising:

a molding member formed on the body to encase the lower and upper devices.

* * * * *